United States Patent [19]

Sakao

[11] Patent Number: 5,084,419

[45] Date of Patent: Jan. 28, 1992

[54] METHOD OF MANUFACTURING SEMICONDUCTOR DEVICE USING CHEMICAL-MECHANICAL POLISHING

[75] Inventor: Masato Sakao, Tokyo, Japan

[73] Assignee: NEC Corporation, Tokyo, Japan

[21] Appl. No.: 327,602

[22] Filed: Mar. 23, 1989

[30] Foreign Application Priority Data

Mar. 23, 1988 [JP] Japan ................... 63-70606

[51] Int. Cl.⁵ ................... H01L 21/00; H01L 21/02; H01L 21/20; H01L 21/76
[52] U.S. Cl. ................... 437/228; 437/89; 437/225; 148/DIG. 51; 148/DIG. 131; 156/643; 156/646
[58] Field of Search ........... 437/89, 225, 228; 148/DIG. 51, DIG. 131; 427/43.1; 156/643, 659.1, 662; 204/192.32, 192.35

[56] References Cited

U.S. PATENT DOCUMENTS

| | | |
|---|---|---|
| 3,574,008 | 4/1971 | Rice . |
| 4,377,438 | 3/1983 | Moriya et al. ............. 156/643 |
| 4,481,070 | 11/1984 | Thomas et al. ............. 156/643 |
| 4,554,728 | 11/1985 | Shepard ................... 437/78 |
| 4,568,601 | 2/1986 | Araps et al. ............. 427/43.1 |
| 4,604,162 | 8/1986 | Sobczak ................... 427/308 |

FOREIGN PATENT DOCUMENTS

| | | |
|---|---|---|
| 50-99685 | 4/1975 | Japan . |
| 0093252 | 6/1983 | Japan ................... 437/89 |
| 0063013 | 4/1986 | Japan . |

OTHER PUBLICATIONS

"Novel LSI/SOI Wafer Fabrication Using Device Layer Transfer Technique", Hamaguchi et al, IEDM 85, pp. 688-691 (1985).

"Scaled CMOS Technology Using SEG Isolation and Buried Well Process", Endo, et al, IEEE Transactions on Electron Devices, vol. ED-33, No. 11, pp. 1659-1666 (Nov. 1986).

*Primary Examiner*—Brian E. Hearn
*Assistant Examiner*—B. Everhart
*Attorney, Agent, or Firm*—Burns, Doane, Swecker & Mathis

[57] ABSTRACT

A method of manufacturing a semiconductor device in which a portion of a monocrystalline silicon layer protruded from a surface of an insulating member is polished up to the surface by a chemical-mechanical polishing is disclosed. A polycrystalline silicon layer and a leveling material are formed in sequence on the protruded portion of the monocrystalline silicon layer and on an exposed part of the surface of the insulating member, and a reactive ion etching and the chemical-mechanical polishing are carried out.

4 Claims, 4 Drawing Sheets

METHOD OF MANUFACTURING SEMICONDUCTOR DEVICE USING CHEMICAL-MECHANICAL POLISHING

BACKGROUND OF THE INVENTION

1. Field of the Invention

The present invention relates to a method of manufacturing a semiconductor device, and more particularly to a method of forming silicon regions on a substrate by chemical-mechanical polishing.

2. Description of Related Art

With the complication and diversification of the manufacturing process of semiconductor devices, particularly integrated circuits (ICs), polishing has been employed to remove completely a silicon layer existing on an insulating film such as a silicon dioxide film ($SiO_2$), silicon nitride film ($Si_3N_4$) or aluminum oxide film ($Al_2O_3$) to thereby form a flat surface, in addition to polishing of the semiconductor substrate (wafer) itself. In this case, the polishing must be stopped when the surface of the insulating film is exposed so that only portions protruded from the surface of the insulating film are polished. To meet the requirements, it is preferable to employ selective chemical-mechanical polishing having a considerably high ratio of the rate of polishing of silicon layer to the rate of polishing of insulating film. The word "selective" means that, between the silicon and insulating material, only silicon at its protruded portions is polished. In the selective chemical-mechanical polishing, polishing proceeds in such a manner that a reaction product resulting from a reaction of silicon with a polishing liquid is removed with a polishing cloth (pad). Since the polishing liquid does not react with an insulating film, no polishing proceeds in regard to the insulating film. Thus, it is possible to obtain a high ratio of the rate of polishing of the silicon to the rate of polishing of the insulating film. The technology is described in Japanese Patent Laid-Open No. 50-99685 (1975), or in IEDM 85, pp. 688 to 691, entitled "NOVEL LSI/SOI WAFER FABRICATION USING DEVICE LAYER TRANSFER TECHNIQUE" by T. Hamaguchi et al.

On the other hand, a technology, in which an epitaxial silicon layer is selectively grown in an aperture of an insulating film formed on a silicon substrate in a mushroom fashion to form a semiconductor element therein, is disclosed in U.S. Pat. No. 3,574,008, or in IEEE TRANSACTIONS ON ELECTRON DEVICES, VOL. ED-33, NO. 11, NOVEMBER 1986, pp. 1659 to 1666, entitled "Scaled CMOS Technology Using SEG Isolation and Buried Well Process" by N. Endo et al.

However, in the case where a silicon layer is not present on the whole surface of an insulating film but partially present thereon with a certain configuration, it is impossible with the conventional chemical-mechanical polishing to polish the silicon layer uniformly so as to form a flat surface. This is because, in polishing of a silicon layer partially existing on an insulating film, polishing proceeds mainly from the corners and side surfaces of the silicon layer but it proceeds only slightly from the upper surface thereof. More particularly in the case where the silicon layer on the insulating film has a small area and/or is thick, the thickness of the silicon film is fast reduced by the effect of polishing which proceeds from the corners (upper edges) and the side surfaces, whereas, in the case where the silicon layer on the insulating film has a large area and/or is thin, polishing that proceeds from the side surfaces makes a small contribution to the reduction of the film thickness and therefore the thickness of the silicon film is not fast reduced. In other words, there is dependence of the polishing rate on the area or the thickness of the silicon layer. Accordingly, when silicon layers having various sizes are present on an insulating film, it is impossible with the conventional chemical-mechanical polishing to realize uniform polishing of all the silicon layers and formation of a flat surface.

As has been described above, in the case where a silicon layer which is partially present on an insulating film is polished by the conventional selective chemical-mechanical polishing technique, uniform polishing cannot be effected due to the dependence on the area, configuration, etc. of the single crystal (monocrystalline) silicon layer and it is therefore impossible to form a flat surface.

SUMMARY OF THE INVENTION

Accordingly, it is an object of the present invention to polish uniformly a silicon layer which is partially present on an insulating film irrespective of the area, configuration, etc. of the silicon layer and automatically stop polishing when the insulating film is exposed, thereby forming a flat surface, and thus eliminating the above-described disadvantages of the prior art.

According to one feature of the present invention, there is provided a method of manufacturing a semiconductor device comprising the steps of forming a combination structure of an insulating member having an upper surface, and first and second monocrystalline silicon layers each having a lower portion positioned at a lower level than the upper surface of the insulating member and an upper portion positioned at a higher level than the upper surface of the insulating member, the first and second monocrystalline silicon layers being separated from each other so as to expose selectively the upper surface of the insulating member; forming a polycrystalline silicon layer covering and attached to the upper portions of the first and second monocrystalline silicon layers and the exposed upper surface of the insulating member entirely; forming a leveling material covering and attached to an upper surface of the polycrystalline silicon layer, the leveling material having an upper surface flatter than the upper surface of the polycrystalline silicon layer; carrying out a reactive ion etching to remove the leveling material entirely, said polycrystalline silicon layer partially and the upper portions of the first and second monocrystalline silicon layers partially so as to form a first flat surface including upper surfaces of the remaining monocrystalline and polycrystalline silicon layers, the first flat surface being positioned at a higher level than the upper surface of the insulating member; and carrying out a chemical-mechanical polishing from the first flat surface up to the upper surface of the insulating member so as to form a second flat surface including the upper surface of the insulating member and upper surfaces of the remaining lower portions of the first and second monocrystalline silicon layers.

According to another feature of the present invention, there is provided a method of manufacturing a semiconductor device comprising the steps of forming an insulating film on a major surface of a monocrystalline silicon substrate, the insulating film having an upper surface, forming an aperture in the insulating film from the upper surface to expose the major surface of the substrate, growing a monocrystalline silicon layer by a vapor phase epitaxy method in the aperture and on selective portions of the upper surface of the insulating film near the aperture such that other portions of the upper surface of the insulating film remote from the aperture are exposed without forming the monocrystalline silicon layer thereon, depositing a polycrystalline silicon layer on the monocrystalline silicon layer and on the exposed portions of the upper surface of the insulating film entirely, forming a leveling material layer on the upper surface of the polycrystalline silicon layer entirely, the leveling material having a nature that its upper surface can be flatter than the upper surface of the polycrystalline silicon layer, conducting a reactive ion etching to the leveling material layer and to the polycrystalline and monocrystalline silicon layers in a condition of all of the layers being etched with a substantially equal etching speed to each other to form a first flat surface including the monocrystalline silicon layer and the polycrystalline silicon layer, and conducting a chemical-mechanical polishing to the remaining monocrystalline silicon layer and the polycrystalline silicon layer up to the upper surface of the insulating film to form a second flat surface including the insulating film and the monocrystalline silicon layer which is formed within the aperture. The leveling material may be composed of styrene series material, such as polystyrene, and the leveling material may be further flattened its upper surface by a heat treatment after forming it by a spincoating method.

DESCRIPTION OF AN EMBODIMENT

Figure 1A:
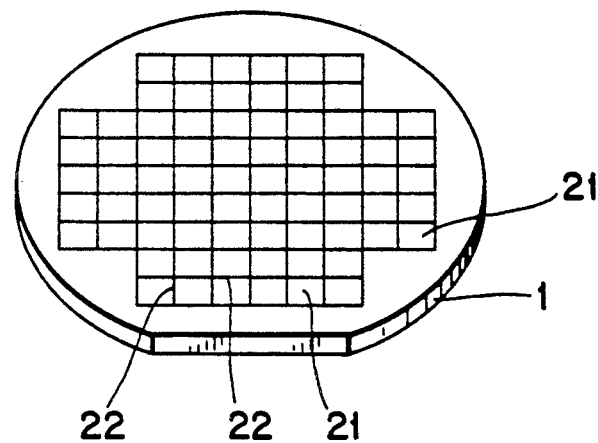
FIG. 1A is a perspective view showing a silicon wafer to which the present invention is adapted.
Figure 1B:
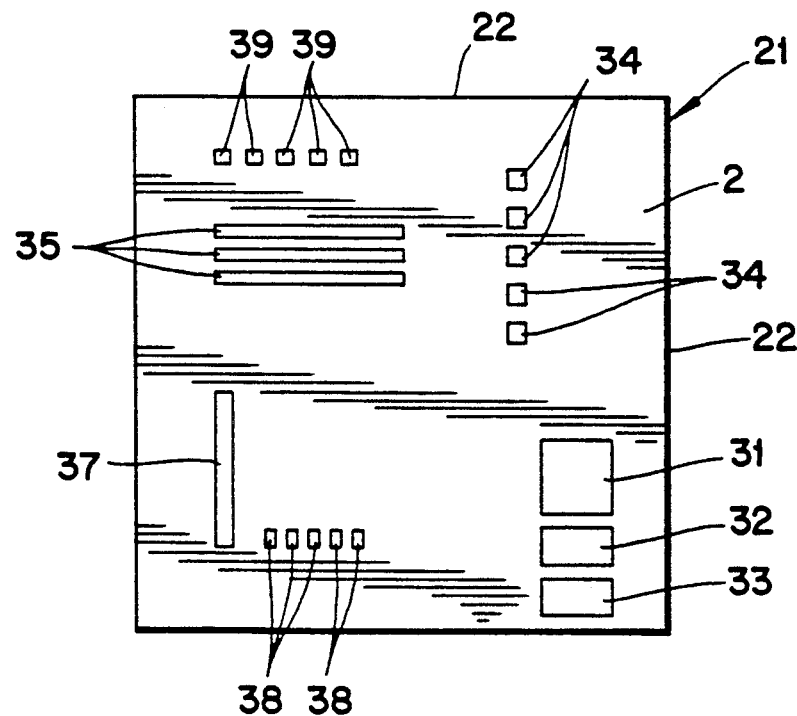
FIG. 1B is an enlarged plan view showing one semiconductor chip (semiconductor pellet or semiconductor device) installed in the silicon wafer.

Referring to FIGS. 1A and 1B, a plurality of semiconductor chips (semiconductor devices) 21 are installed on a silicon substrate (wafer) 1 in a matrix form and delineated by a plurality of scribe or dividing lines 22, and in each of the semiconductor chips, a plurality of element forming regions 31 to 39 having various plan shapes and surrounded by a thick field insulating layer 2 are provided. For example, the element forming region 31 has a large plan shape of 5.0 $\mu$m square (5.0 $\mu$m×5.0 $\mu$m), whereas the element forming region 39 has a small plan shape of 1.0 $\mu$m square (1.0 $\mu$m×1.0 $\mu$m).

Each element forming region is formed by growing monocrystalline (single crystal) silicon through selective epitaxial method on the monocrystalline (single crystal) silicon wafer within an aperture of the insulating layer so as to fill the aperture completely with the silicon, and conducting chemical-mechanical polishing to a portion of the silicon protruded from the upper surface of the insulating layer so as to form a flat surface consisting of the upper surface of the insulating layer and an upper surface of remaining silicon within the aperture, that is, of the element forming region. The chemical-mechanical polishing is that the protruded silicon is pressed in sliding contact with a polishing pad attached to a polishing table moving horizontally with respect to the wafer. The moving polishing pad as one abrasive is continuously dipped with an alkali solution containing fine solid particles such as silicon dioxide particles as another abrasive. The moving polishing pad may be immersed into the alkali solution with the semiconductor wafer including the silicon grown by selective epitaxial method. The solid particles may be omitted in the solution, and generally, the alkali solution is an amine solution, for example, piperazine. The alkali solution plays a role to form silicon hydroxide chemically at the surface of the monocrystalline silicon layer and the silicon hydroxide is mechanically removed by the moving polishing pad, to conduct the chemical-mechanical polishing.

Figure 2:
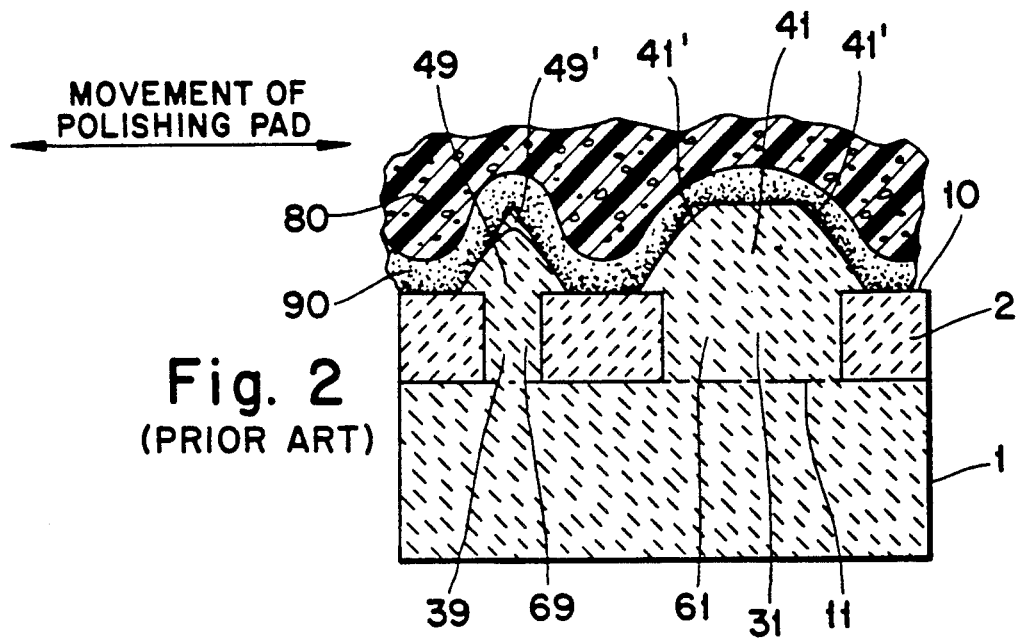
FIGS. 2 and 3 are cross-sectional views showing process steps in a prior art.
Figure 3:
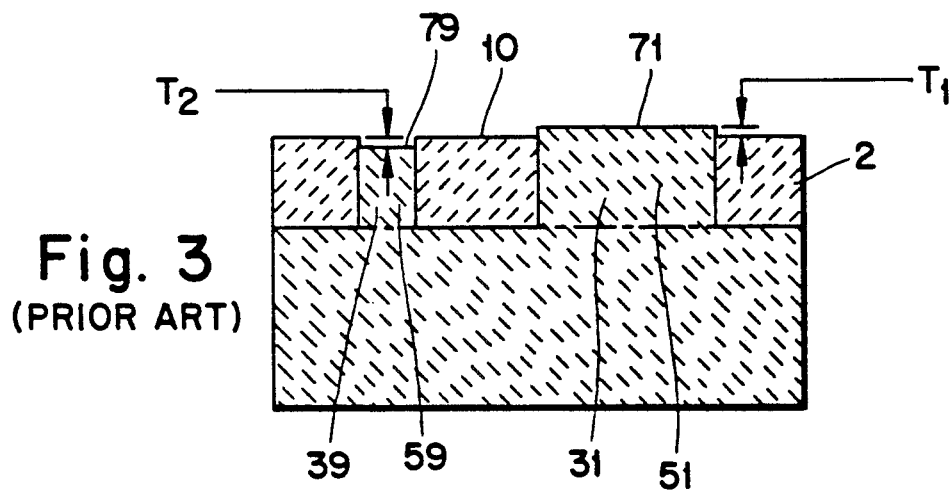

Referring to FIGS. 2 and 3, a conventional method will be explained. On the major surface 11 of the p-type silicon substrate (wafer) 1, the silicon oxide layer 2 of 6,000 Å thickness is formed, and a first aperture 61 of 5 $\mu$m square (5 $\mu$m×5 $\mu$m) plan shape and a second aperture 69 of 1.0 $\mu$m square (1 $\mu$m×1 $\mu$m) plan shape are provided in the silicon oxide layer 2 to expose the surface sections 11 of the substrate 1, respectively. Then, monocrystalline (single) silicon layers 41, 49 are grown through selective epitaxial growing method under depressed pressure at 850° C. by flowing $SiH_2Cl_2$ (dichlorosilane)+$H_2$ (hydrogen)+HCl (hydrogen chloride) series mixture gas within an LPCVD (low pressure chemical vapor deposition) apparatus, by using the monocrystalline silicon of the major surface 11 of the substrate within the apertures as a seed, respectively. The silicon layer 41 at the first element forming region 31 of a large area fills the first aperture 61 and protrudes up to 1.5 $\mu$m from the upper surface 10 of the silicon oxide layer 2 with a trapezoid shape, and the silicon layer 49 at the second element forming region 39 of a small area fills the second aperture 69 and protrudes up to 1.5 $\mu$m from the upper surface 10 of the silicon oxide layer 2 with a triangle shape because of the small plan area. Then, the chemical-mechanical polishing is conducted by using piperazine solution 90 having the piperazine concentration of 0.04 to 0.8 g/l containing silica particles of 0 to 3% as an alkali solution or amine solution, and the moving polishing pad 80 made of polyurethane. The polishing pad 80 has a flat surface in a macro view. However, minor convexities and concavities are produced in a micro view, and the pad moves horizontally, relatively the wafer, with keeping pressure of 100 to 200 g/cm² to the protruded silicon sections. Therefore, the upper edge parts (corners) 41', 49' (represented by left-upward hatching in FIG. 2) of the protruding silicons are predominantly polished. Consequently, the silicon layer 49 having the triangle shape is reduced in its height faster than that of the silicon layer 41 having the trapezoid shape. When the polishing continues during 60 minutes, for example, the remaining monocrystalline silicon layer 51 within the first aperture at the first element forming region 31 has the upper surface 71 higher level $T_1$ of 500 Å higher than the upper surface 10 of the silicon oxide layer 2, and the remaining monocrystalline silicon layer 59 within the second aperture at the second element forming region 39 has the upper surface lower level $T_2$ of 100 Å lower than the upper surface 10 of the silicon oxide layer 2 (FIG. 3). If the polishing continues further so as to $T_1$ being 0 (zero), the $T_2$ would become 600 Å. That is, the about 600 Å difference between the upper surface 71 and the upper surface 79 is inevitable.

The uneven flatness causes problems such that wirings formed on the element forming regions and the silicon oxide layer are apt to break down and/or the isolation between the elements formed in the respective element forming regions becomes difficult. The problems are more serious in semiconductor devices of high integrated density and fine pattern.

Referring to FIGS. 4 to 10, an embodiment of the present invention will be explained. In FIGS. 4 to 10, the same component as those in FIGS. 1 to 3 are indicated by the same reference numerals.

Figure 4:
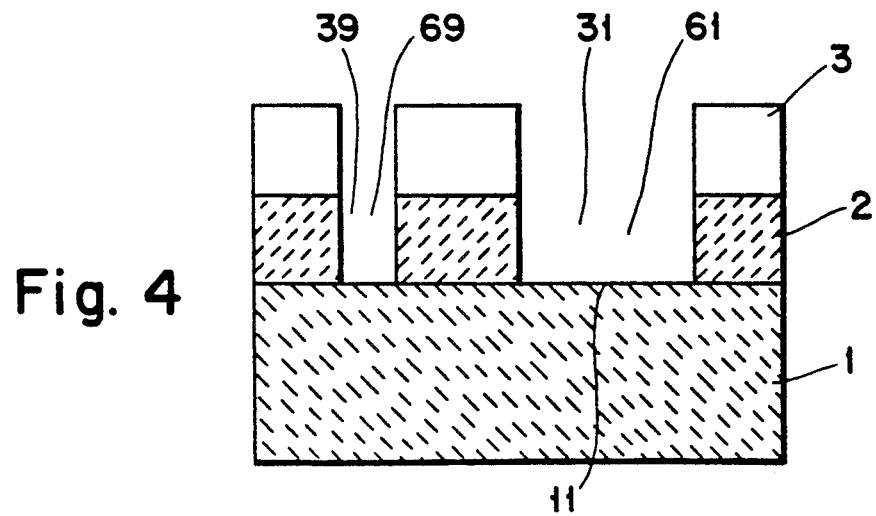
FIGS. 4 to 9 are cross-sectional views showing an embodiment of the present invention.

At first, on the major surface 11 of the P-type (100) monocrystalline silicon substrate 1, a silicon oxide layer 2 of 6,000 Å thickness is formed, and a plurality of apertures having various plan shapes including the first aperture 61 of 5.0 μm square (5.0 μm×5.0 μm) at the first element forming region 31 and a second aperture 69 of 1.0 μm square (1.0 μm×1.0 μm) at the second element forming region 39, are formed by ordinary dry etching or wet etching process using a photo-resist pattern 3 as a mask. (FIG. 4)

Figure 5:
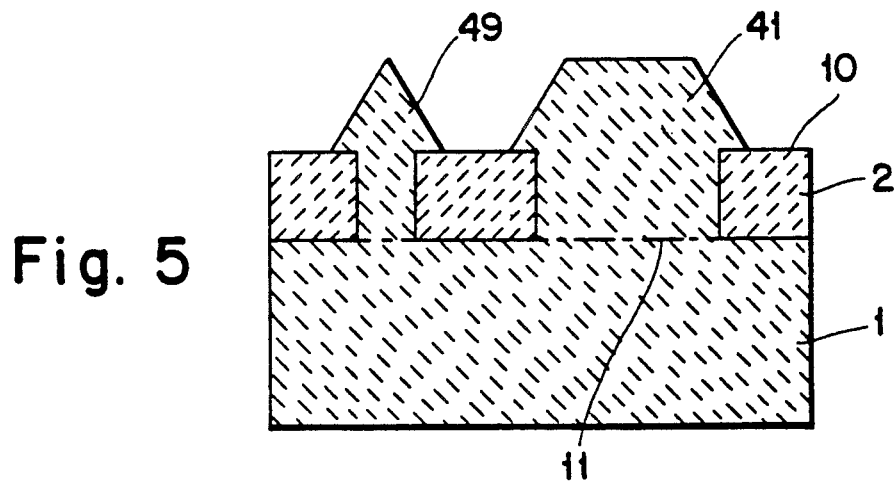

Next, the monocrystalline silicon layers 41, 49 are formed by the same manner as in FIG. 2 mentioned before. (FIG. 5)

The silicon layers 41, 49 are separated to each other because the growing speed of the silicon in the horizontal direction is very low, and therefore, the surface 10 of the silicon oxide layer 2 between the silicon layers is exposed.

Figure 6:
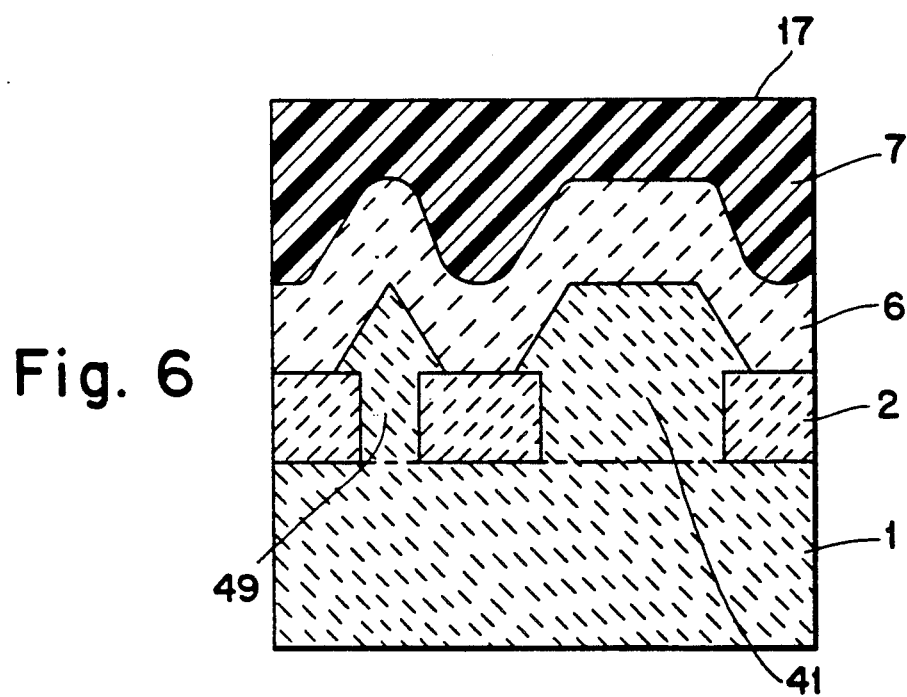

Next, a polycrystalline silicon layer 6 of 8,000 Å thickness is deposited on the monocrystalline silicon layers 49, 41 and the exposed portions of the surface 10 of the silicon oxide layer 2, entirely, at 620° C. by flowing SiH$_4$ (monosilane) gas within an LPCVD apparatus, then a leveling material layer 7 made of styrene series, for example, polystyrene and having about 4 μm thickness is formed on the polycrystalline silicon layer 6 entirely by a well-known spin-coating method followed by a heat treatment at 190° C., during 1.0 hour, under nitrogen atmosphere to render the upper surface 17 thereof further flat. (FIG. 6)

Figure 7:
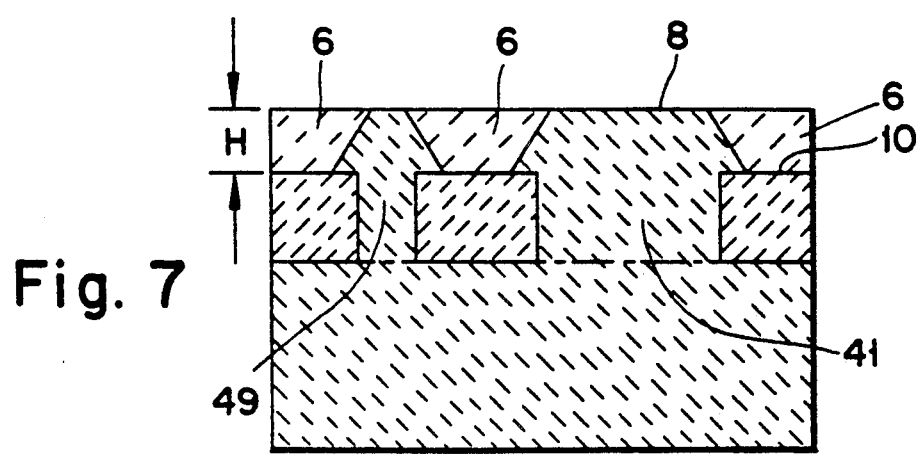

Next, a reactive ion etching is conducted to the leveling material layer 7 and upper sections of the polycrystalline silicon layer 6 and monocrystalline silicon layers 41, 49 to form a first flat surface 8 consisting of the upper surfaces of remaining monocrystalline silicon layers 41, 49 and of remaining polycrystalline silicon layer 6 at a level H of 5,000 Å higher than the upper surface 10 of the silicon oxide layer. (FIG. 7)

In the reactive ion etching, the etching speed of polycrystalline and monocrystalline silicon and that of the leveling material must be substantially equal to each other. Therefore, when the leveling material is made of styrene series such as polystyrene as in the embodiment, the following reactive etching conditions are exemplified so as to obtain about 500 Å/min etching speed in both of silicon and styrene material:

flowing a mixture gas of CCl$_4$F$_2$ (dichlorodifluoromethane) and O$_2$ (oxygen) within a cathode-coupled type RIE apparatus under a low pressure of 5 Pascal and RF electric power of 500 watts.

Figure 8:
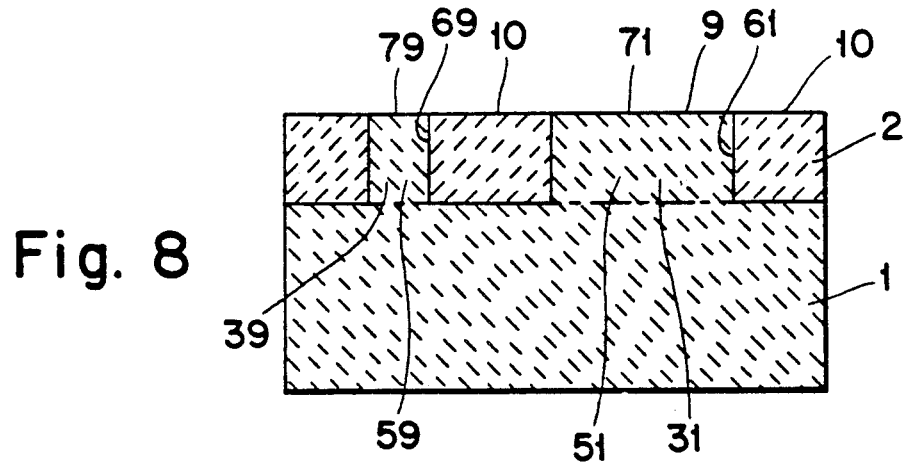
Figure 9:
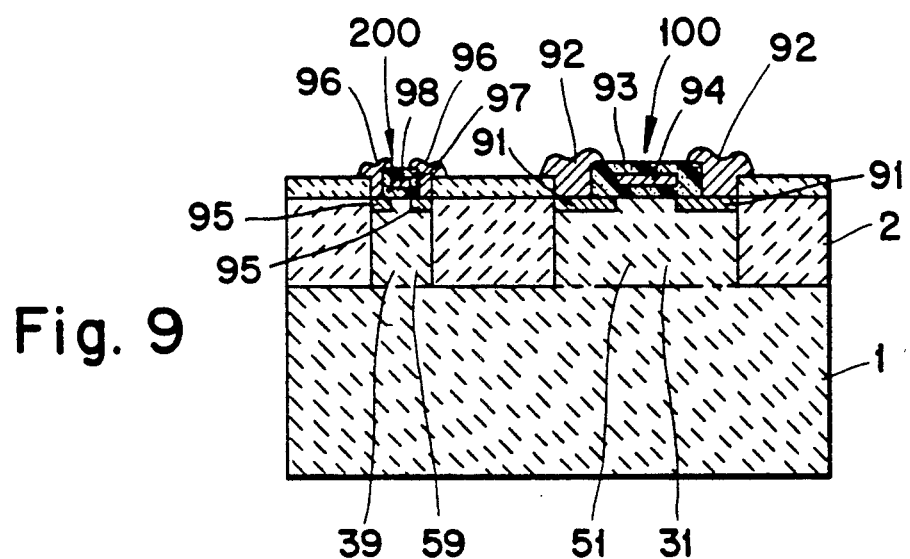
Figure 10:
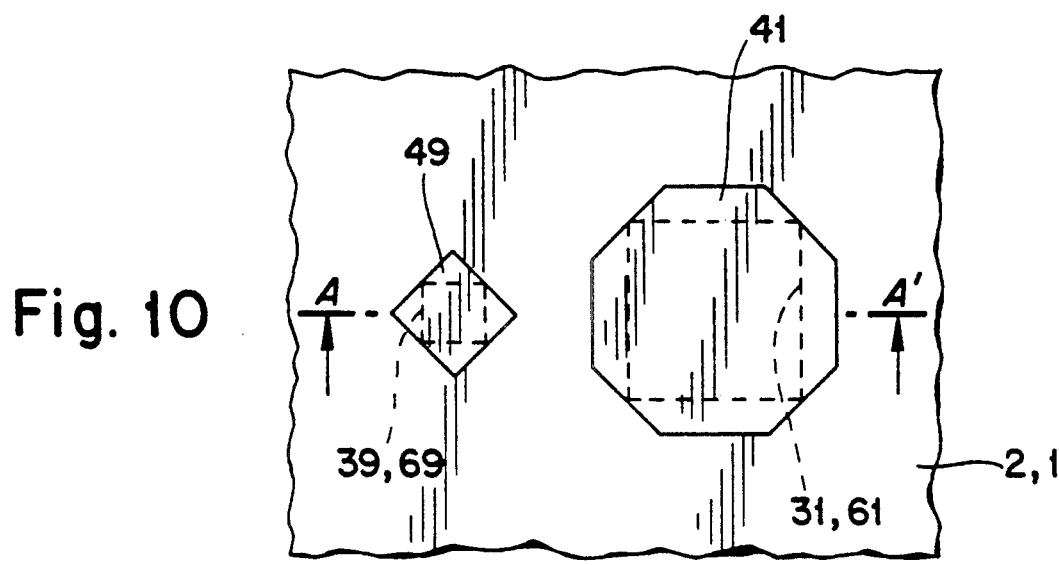
FIG. 10 is a plan view in the process step shown in FIG. 5, and FIGS. 4 to 9 correspond to a portion taken along line A-A' in FIG. 10 as viewed in the direction of arrows.

Next, the first flat surface 8 is subjected to the chemical-mechanical polishing as in FIG. 2 mentioned before during 20 minutes by using the moving polishing pad of polyurethane and the piperazine solution as an organic amine solution of polishing liquid. The mono-crystalline (single crystal) silicon layers 41, 49 and the polycrystalline silicon layer 6 can be polished at the same polishing rate, and any upper edge of layers 41, 49 is not exposed at its side, that is, any exposed corner does not exist and, since the polishing rate of the insulating layer 2 is much lower than that of the single crystal silicon layers and the polycrystalline silicon layer, the polycrystalline silicon layer 6 can be removed and the polishing of the single crystal silicon layers 41, 49 stops at the level of the insulating layer 2. Accordingly, it is possible to readily form a second flat surface 9, as shown in FIG. 8. That is, according to the present invention, the surface 9 consisting of the upper surface 10 of the silicon oxide layer 2 and the upper surfaces 71, 79 of the remaining monocrystalline silicon layers 51, 59 in the element forming regions 31, 39 becomes co-planar such that the level difference between the surface 71 and surface 79 is 200 Å or less.

After conducting an ion-implantation of boron into the remaining monocrystalline silicon layers 51, 59 within the apertures 61, 69 to render the layers to P-type, a first transistor 100 including N-type source, drain regions 91, a gate insulating film 93, a gate electrode 94 and wiring electrodes 92 is formed on the monocrystalline silicon layer 51 at the first element forming region 31, and also a second transistor 200 including N-type source, drain regions 95, a gate insulating film 97, a gate electrode 98 and wiring electrodes 96 is formed on the monocrystalline silicon layer 59 at the second element forming region 39.

In the embodiment, the two mushroom type silicon layers 41, 49 in the process step of FIG. 5 have the same thickness, that is, the same height from the surface 10 of the insulating film 2 to each other. However, of course, even if the height of the silicon layers 41, 49 is different to each other at the step in FIG. 5, the advantage of the present invention can be obtained. Further, the silicon layers 41, 49 in the embodiment are formed by a selective epitaxial method by using the surface 11 of the substrate 1 within the apertures as a seed. However, the present invention can be applied to all structures in which a silicon layer is protruded from a surface of an insulating member such as an insulating film and the protruded portion of the silicon layer is intended to polish up to the surface of the insulating member, irrespective of method per se for forming the protruding silicon layer. Moreover, although the aperture in the embodiment has the side wall straight from the upper portion to the bottom, as shown in drawings, the side wall of the aperture may be of a step-like shape such that the aperture consists of an upper aperture of a large plan area and a lower aperture of a small plan area to expose the small area of the substrate.

What is claimed is:

1. A method of manufacturing a semiconductor device comprising the steps of:

forming an insulating layer on a surface of a monocrystalline silicon substrate, said insulating layer having an upper surface and having first and second apertures from said upper surface to said surface of said substrate to expose parts of said surface of said substrate, said first and second apertures having different areas from each other; forming selectively first and second monocrystalline silicon layers from said exposed surface parts of said substrate by using said exposed surface parts of said substrate as seeds, respectively, through selective epitaxial growing method, said first and second monocrystalline silicon layers having upper portions positioned at higher levels than said upper surface of said insulating layer, respectively, and said first and second monocrystalline silicon layers being separated from each other so as to expose selectively said upper surface of said insulating layer;

forming a polycrystalline silicon layer as a first sacrificial layer covering and attached to said upper portions of said first and second monocrystalline silicon layers and said exposed upper surface of said insulating layer, entirely;

forming a leveling material as a second sacrificial layer made of styrene series covering and attached to an upper surface of said polycrystalline silicon layer entirely, said leveling material having an upper surface flatter than said upper surface of said polycrystalline silicon layer;

carrying out a reactive ion etching to remove said leveling material entirely, said polycrystalline silicon layer partially and said upper portions of said first and second monocrystalline silicon layers partially so as to form a first flat surface including upper surfaces of remaining said first and second monocrystalline silicon and polycrystalline silicon layers, said first flat surface being positioned at a higher level than said upper surface of said insulating layer; and carrying out a chemical-mechanical polishing by using a polishing pad which moves in parallel relation to said upper surface of said insulating layer, said chemical-mechanical polishing being conducted from said first flat surface up to said upper surface of said insulating layer so as to remove said polycrystalline silicon layer entirely and to form a second flat surface including said upper surface of said insulating layer and upper surfaces of remaining said lower portions of said first and second monocrystalline silicon layers.

2. A method of manufacturing a semiconductor device of claim 1, in which said first and second monocrystalline silicon layers each have different plan shapes.

3. A method of manufacturing a semiconductor device of claim 1, in which said styrene series is polystyrene.

4. A method of manufacturing a semiconductor device comprising the steps of:
forming an insulating film on a major surface of a monocrystalline silicon substrate, said insulating film having an upper surface, forming an aperture in said insulating film from said upper surface to expose said major surface of said substrate, growing a monocrystalline silicon layer by a vapor phase epitaxy method in said aperture and on selective portions of said upper surface of said insulating film near said aperture such that other portions of said upper surface of said insulating film remote from said aperture are exposed without forming said monocrystalline silicon layer thereon, depositing a polycrystalline silicon layer as a first sacrificial layer on said monocrystalline silicon layer and on said exposed portions of said upper surface of said insulating film, entirely, forming a leveling material layer as a second sacrificial layer on the upper surface of said polycrystalline silicon layer entirely, said leveling material layer having a nature to flatten its upper surface flatter than said upper surface of said polycrystalline silicon layer, conducting a reactive ion etching on said leveling material layer and on said polycrystalline and monocrystalline silicon layers in a condition of all of said layers being etched with a substantially equal etching speed to each other to remove entirely said leveling material layer, partially said polycrystalline silicon layer and partially said monocrystalline layer and to form a first flat surface including said monocrystalline silicon layer and said polycrystalline silicon layer, and conducting a chemical-mechanical polishing by using a polishing pad which moves in parallel relation to said upper surface of said insulating film on remaining said monocrystalline silicon layer and said polycrystalline silicon layer up to said upper surface of said insulating film to remove entirely said polycrystalline silicon layer and partially said monocrystalline layer and to form a second flat surface including said insulating film and said monocrystalline silicon layer which is formed within said aperture.

* * * * *